(12) United States Patent
Breitwisch et al.

(10) Patent No.: US 7,514,705 B2
(45) Date of Patent: Apr. 7, 2009

(54) PHASE CHANGE MEMORY CELL WITH LIMITED SWITCHABLE VOLUME

(75) Inventors: Matthew J. Breitwisch, Yorktown Heights, NY (US); Chung Hon Lam, Peekskill, NY (US); Jan Boris Philipp, Peekskill, NY (US); Stephen M. Rossnagel, Pleasantville, NY (US); Alejandro Gabriel Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 424 days.

(21) Appl. No.: 11/410,466

(22) Filed: Apr. 25, 2006

(65) Prior Publication Data

US 2007/0246748 A1    Oct. 25, 2007

(51) Int. Cl.
*H01L 47/00* (2006.01)
(52) U.S. Cl. .................. 257/2; 257/4; 257/5
(58) Field of Classification Search .............. 257/1–5
See application file for complete search history.

(56) References Cited

U.S. PATENT DOCUMENTS

| | | | |
|---|---|---|---|
| 6,815,704 B1 * | 11/2004 | Chen | 257/2 |
| 7,012,273 B2 * | 3/2006 | Chen | 257/4 |
| 7,164,147 B2 * | 1/2007 | Lee et al. | 257/4 |
| 7,233,054 B1 * | 6/2007 | Anh et al. | 257/3 |
| 7,394,088 B2 * | 7/2008 | Lung | 257/2 |
| 2003/0209746 A1 | 11/2003 | Horii | |
| 2005/0110001 A9 | 5/2005 | Chen et al. | |

OTHER PUBLICATIONS

U.S. Appl. No. 11/100,312, filed Apr. 6, 2005, and entitled "Structure for Confining the Switching Current in Phase Memory (PCM) Cells."
A. Pirovano et al., "Electronic Switching in Phase-Change Memories," IEEE Transactions on Electron Devices, vol. 51, No. 3, pp. 452-459, Mar. 2004.
A.L. Lacaita et al., "Electrothermal and Phase-Change Dynamics in Chalcogenide-Based Memories," Electron Devices Meeting, IEDM Technical Digest, IEEE International, 4 pages, 2004.

* cited by examiner

*Primary Examiner*—Cuong Q Nguyen
(74) *Attorney, Agent, or Firm*—Ido Tuchman; Ryan, Mason & Lewis, LLP

(57) ABSTRACT

A memory cell comprises a dielectric layer and a phase change material. The dielectric layer defines a trench having both a wide portion and a narrow portion. The narrow portion is substantially narrower than the wide portion. The phase change material, in turn, at least partially fills the wide and narrow portions of the trench. What is more, the phase change material within the narrow portion of the trench defines a void. Data can be stored in the memory cell by heating the phase change material by applying a pulse of switching current to the memory cell. Advantageously, embodiments of the invention provide high switching current density and heating efficiency so that the magnitude of the switching current pulse can be reduced.

13 Claims, 4 Drawing Sheets

SWITCHABLE VOLUME

PHASE CHANGE MEMORY CELL WITH LIMITED SWITCHABLE VOLUME

FIELD OF THE INVENTION

This invention relates to memory cells in integrated circuits, and, more particularly, to memory cells comprising phase-change materials.

BACKGROUND OF THE INVENTION

The possibility of using phase change materials (PCMs) in nonvolatile memory cells has recently gained momentum as more is learned about these materials and their integration into integrated circuits. When incorporated in a memory cell, these materials can be toggled between higher and lower electrical resistance states by applying a pulse of electrical current ("switching current pulse") to the memory cell. Subsequently, after writing to a memory cell in this way, the electrical resistance state of the given memory cell can be determined (i.e., read) by applying a low magnitude sensing voltage to the material in order to determine its electrical resistance state.

Currently, binary and ternary chalcogenide alloys such as doped SbTe and $Ge_2Sb_2Te_5$ (GST) are showing the greatest promise for use in practical PCM-based memory cells. A. Pirovano et al., *Electronic Switching in Phase-Change Memories*, IEEE Transactions on Electron Devices, Vol. 51, No. 3, March 2004, for example, describes such a use of chalcogenides and is incorporated herein by reference. However, the switching of a PCM-based memory cell requires that the switching current pulse produce enough heat in the PCM to cause at least some portion of the PCM to reproducibly change electrical resistance state. The required temperature, for example, may be as high 350 degrees Celsius. If the memory cell is not properly designed, the magnitude of the switching current pulse necessary to create these required temperatures can easily exceed that which can be tolerated by modern integrated circuits.

Fortunately, advances in PCM-based memory cells can be made by recognizing that the heat generated by the switching current pulse in the PCM is largely a function of two factors: 1) the localized switching current density; and 2) the rate of heat dissipation from the volume being heated. U.S. patent application Ser. No. 11/100,312, entitled "Structure for Confining the Switching Current in Phase Memory (PCM) Cells" (filed Apr. 6, 2005), for example, uses sidewall spacers and gas-filled cavities to reduce the required magnitude of the switching current pulse in a PCM-based memory cell. Nevertheless, there remains a need for additional PCM-based memory cell designs that allow the magnitude of the associated switching current pulses to be reduced to a value that is compatible with modem integrated circuits.

SUMMARY OF THE INVENTION

Embodiments of the present invention address the above-identified need by providing PCM-based memory cell designs that both force the switching current to pass through a confined pathway in the PCM and thermally isolate the switching volume. Advantageously, these designs provide high localized switching current density and heating efficiency so that the magnitude of the switching current pulse can be reduced to a value that is compatible with modem integrated circuits.

In accordance with an aspect of the invention, a memory cell comprises a dielectric layer and a PCM. The dielectric layer defines a trench having both a wide portion and a narrow portion. The narrow portion is substantially narrower than the wide portion. The PCM, in turn, at least partially fills the wide and narrow portions of the trench. What is more, the phase change material within the narrow portion of the trench defines a void. A portion of the PCM is operative to switch between lower and higher electrical resistance states in response to the application of a pulse of electrical current to the memory cell In an illustrative embodiment, a memory cell comprises a dielectric layer patterned to have a trench with a wide portion and a narrow portion. A PCM is deposited into this trench such that the PCM within the narrow portion of the trench contains a void. When a switching current pulse is applied to the memory cell, the switching current must circumnavigate this void in the PCM. As a result, the switching current is restricted to a thin, ring-like volume of the PCM in this portion of the memory cell. This results in a high localized current density. The thin, ring-like volume of PCM forming part of the periphery of the void, therefore, becomes the switchable volume of the PCM.

Advantageously, the magnitude of the switching current pulse required to cause the PCM in this limited switchable volume is substantially less than that which would be required to cause an electrical resistance state transition in the remainder of the PCM volume. This memory cell design, therefore, utilizes high localized switching current density and heating efficiency to reduce the required magnitude of the switching current pulse.

These and other features and advantages of the present invention will become apparent from the following detailed description which is to be read in conjunction with the accompanying figures.

DETAILED DESCRIPTION OF THE INVENTION

This invention will be illustrated herein in conjunction with exemplary memory cells for use in integrated circuits and methods for forming such memory cells. It should be understood, however, that the invention is not limited to the particular materials, features and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional integrated circuit device. Rather, certain processing steps which are conventionally used in forming integrated circuit devices, such as, for example, wet cleaning and annealing steps, are purposefully not described herein for economy of description. However one skilled in the art will readily recognize those processing steps omitted from these generalized descriptions. Moreover, details of the processing steps used to fabricate such integrated circuit devices may be found in a number of publications, for example, S. Wolf and R. N. Tauber, *Silicon Processing for the VLSI Era, Volume* 1, Lattice Press, 1986 and S. M. Sze, *VLSI Technology, Second Edition*, McGraw-Hill, 1988, both of which are incorporated herein by reference.

The term phase-change material (PCM) as used herein is intended to encompass any material displaying more than one programmable electrical resistance state for use in integrated circuits. PCMs comprise, for example, various chalcogenides and transition metal oxides and include, but are not limited to, doped or undoped GeSb, SbTe, $Ge_2Sb_2Te_5$ (GST), $SrTiO_3$, $BaTiO_3$, $(Sr,Ba)TiO_3$, $SrZrO_3$, $Ca_2Nb_2O_7$, $(Pr,Ca)MnO_3$, $Ta_2O_5$, $NiO_x$, and $TiO_x$, as well as other suitable materials.

It should also be understood that the various layers and/or regions shown in the accompanying figures are not drawn to scale, and that one or more layers and/or regions of a type commonly used in integrated circuits may not be explicitly shown in a given figure for economy of description. For example, those integrated circuit features associated with what is commonly referred to as the front-end-of-line and middle-of-line are not described herein. This does not imply that the layers and/or regions not explicitly shown are omitted from the actual integrated circuit.

For ease of understanding, the design and operating characteristics of a PCM-based memory cell in accordance with an illustrative embodiment of the invention will be first described. Subsequently, methods for forming the illustrative memory cell embodiment in an integrated circuit will be addressed.

Figure 1:
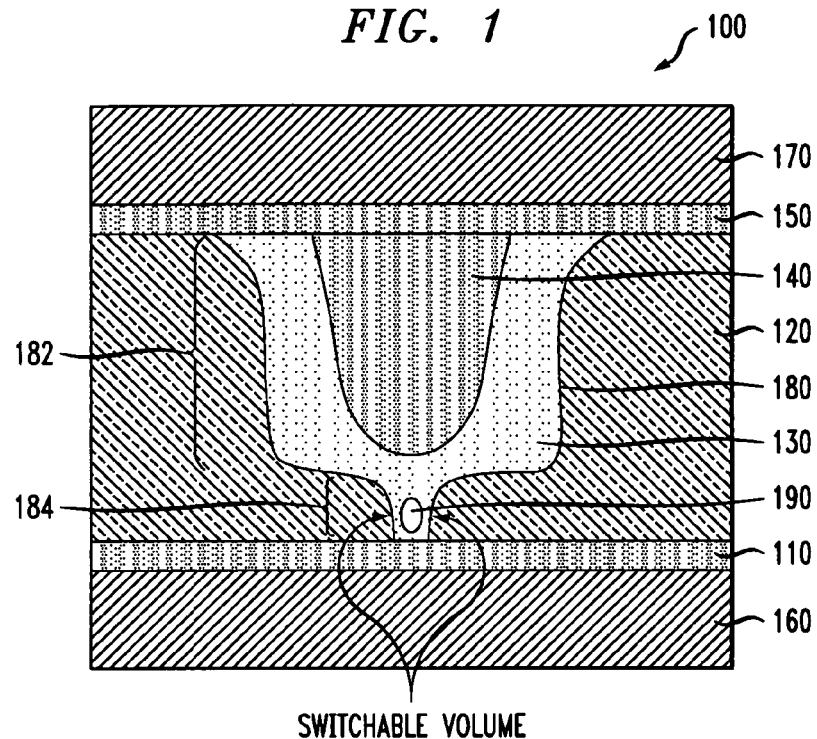
FIG. 1 shows a sectional view of a PCM-based memory cell in accordance with an illustrative embodiment of the invention.

FIG. 1 shows a memory cell 100 in accordance with an illustrative embodiment of the invention. The memory cell comprises lower liner 110, dielectric layer 120, PCM 130, electrode 140 and upper liner 150. These elements are formed between a bottom electrical contact 160 and a top electrical contact 170. The bottom and top electrical contacts, in turn, form part of the metallization of the integrated circuit in which the memory cell is incorporated.

In the memory cell 100, the bottom and top electrical contacts 160, 170 preferably comprise copper. Moreover, the dielectric layer 120 preferably comprises silicon dioxide while the PCM 130 preferably comprises GST. The lower and upper liners 110, 150 and the electrode 140 preferably comprise titanium nitride or tantalum nitride. The lower and upper liners keep the copper in the electrical contacts from diffusing into the dielectric layer and the PCM.

In accordance with an aspect of the invention, the dielectric layer 120 defines a trench 180 characterized by both a wide portion 182 and a narrow portion 184. The PCM 130 fills part of both of these portions. Moreover, the PCM within the narrow portion of the trench comprises a void 190. This void preferably contains a low pressure inert gas such as nitrogen.

Storing data in the memory cell 100 comprises placing some portion of the total volume of the PCM 130 (the "switchable volume") into either a lower electrical resistance polycrystalline state or a higher electrical resistance amorphous state. Transitions between these states are accomplished by heating the switchable volume of the PCM by applying a pulse of switching current to the memory cell through the bottom and top electrical contacts 160, 170. The duration of the switching current pulse is preferably between about one and about 500 nanoseconds and has a fast falling edge (i.e., less than about ten nanoseconds). The fast falling edge acts to freeze the switchable volume of the PCM in its current electrical resistance state without allowing additional time for the bonds within the material to continue to rearrange.

Subsequently, reading the state of the memory cell 100 is accomplished by applying a sensing voltage to the memory cell, again via the bottom and top electrical contacts 160, 170. The ratio of the electrical resistances between the higher and lower electrical resistance states in a typical PCM is between about 100:1 and 1,000:1. The sensing voltage is preferably of low enough magnitude to provide negligible ohmic heating in the PCM 130. Accordingly, the electrical resistance state of the PCM can be determined in this manner without disturbing its written electrical resistance state. Data integrity is thereby maintained while reading the data.

Advantageously, both the unique shape of the trench 180 in the dielectric layer 120 as well as the void 190 in the PCM 130 act to force the switching current to pass through a confined pathway in the PCM. As a result, this memory cell design provides high localized switching current density so that the magnitude of the switching current pulse can be reduced to a value that is compatible with modern integrated circuits.

When, for example, a switching current pulse is applied so that it travels from the bottom electrical contact 160 to the top electrical contact 170, the switching current passes through the lower liner 110 and into the PCM 130 at the bottom of the trench 180. At this point, the current must circumnavigate the void 190. As a result, the switching current passes through the thin, ring-like PCM volume surrounding the void. Subsequently, after leaving the PCM in the narrow portion 184 of the trench, the current travels through the electrode 140 and the PCM in the wide portion 184 of the trench, which largely act in parallel to conduct the current to the upper liner 150.

The confinement of the switching current to the thin, ring-like volume of the PCM 130 surrounding part of the void 190 results in a high localized current density in this volume, and, in turn, high ohmic heating. For this reason, this volume forms the switchable volume of the PCM in the memory cell 100. Outside of this switchable volume, the current density is insufficient to cause the transition between electrical resistance states. The PCM in the wide portion is, therefore, not part of the switchable volume of the PCM. Accordingly, the switching current needed to effect an electrical resistance state change in the memory cell will largely be determined by the thin, ring-like volume of the PCM that forms part of the periphery of the void. The magnitude of this required switching current pulse will be substantially less than that which would be required to cause a state transition in the remainder of the PCM volume.

Moreover, in addition to restricting the switchable volume of the PCM 130 to part of the periphery of the void 190, the memory cell design in FIG. 1 also acts to thermally isolate this switchable volume. Reference to the shape of the PCM in the narrow portion 184 of the trench 180 indicates that non-switching portions of the PCM are located above and below the switchable volume of PCM. Since a PCM such as GST has a very low thermal conductivity when compared to silicon dioxide or a metal, this arrangement tends to trap heat within the switchable volume. Advantageously, this thermal isolation causes the heating efficiency of this switchable volume to be increased, again allowing the magnitude of switching current pulse to be reduced.

Figure 2A:
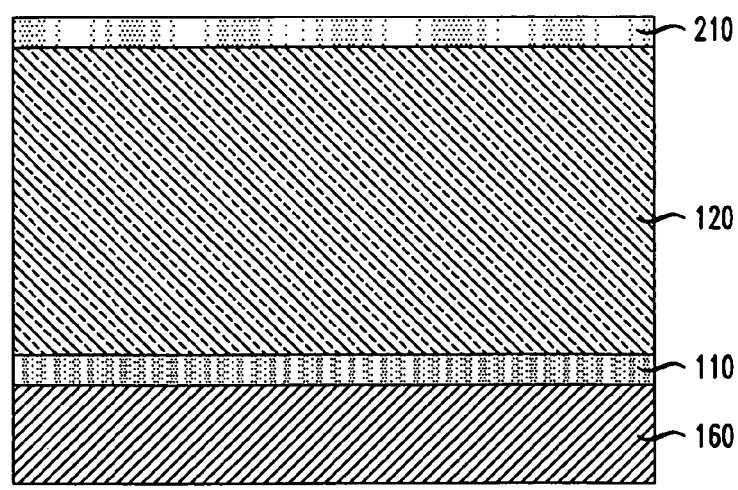
FIGS. 2A-2G show sectional views of the FIG. 1 memory cell during various stages of formation.
Figure 2B:
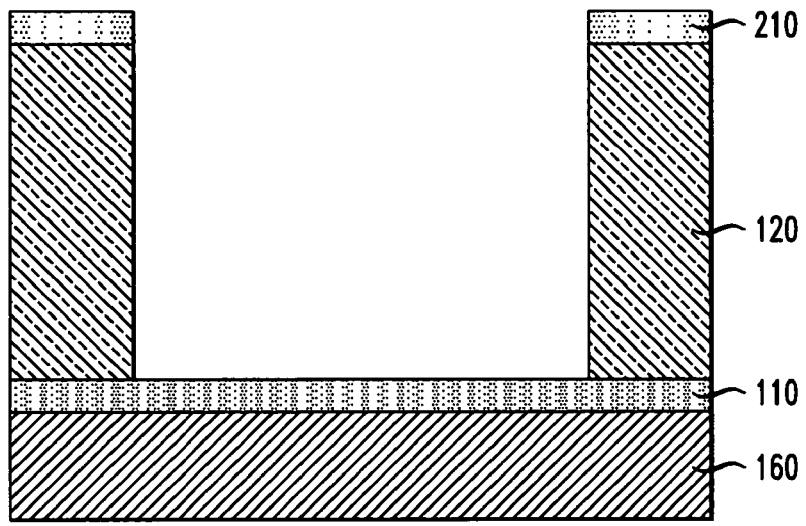

FIGS. 2A-2G show a processing sequence for forming the memory cell 100 shown in FIG. 1. Initially, the lower liner 110 (e.g., tantalum nitride or titanium nitride), the dielectric layer 120 (e.g., silicon dioxide) and a masking layer 210 (e.g., silicon nitride) are sequentially deposited on top of the bottom electrical contact 160 (e.g., copper), resulting in the film stack shown in FIG. 2A. These films are preferably deposited using chemical vapor deposition (CVD). Next, conventional photolithography and an anisotropic etching technique, preferably reactive ion etching (RIE), are used to remove portions of the masking layer and the dielectric layer in those regions of the integrated circuit where memory cells are to be formed. The patterned masking layer and dielectric layer are shown in FIG. 2B.

Figure 2C:
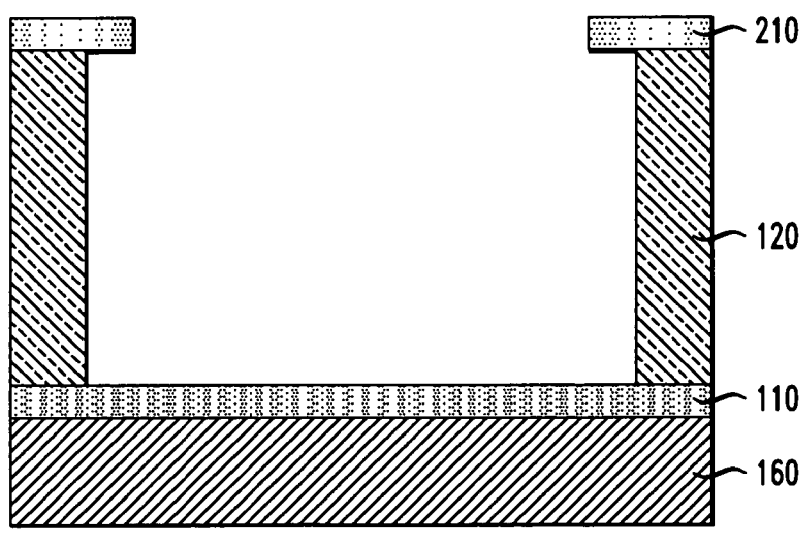

Subsequently, the film stack in FIG. 2B is exposed to an isotropic wet chemical etch that is adapted to etch the dielectric layer 120 but to not etch the masking layer 210. If the dielectric layer comprises silicon dioxide and the masking layer comprises silicon nitride, this wet etch may be accomplished by, for example, hydrofluoric acid. The wet chemical etch causes the dielectric layer to be "pulled back" under the masking layer. This causes the masking layer to overhang the dielectric layer as shown in FIG. 2C.

After the overhang is formed in the masking layer 210, an additional layer of dielectric material is conformally deposited on the film stack. If the dielectric layer 120 is formed of silicon dioxide, the conformal deposition may comprise, for example, the deposition of additional silicon dioxide by the CVD of tetraethoxysilane or a combination of silane and oxygen. The conformal deposition will deposit the dielectric material on all the exposed surfaces of the film stack, thereby adding material to the dielectric layer. Notably, the overhanging masking layer and the growing together of the dielectric material from the various exposed surfaces causes a keyhole-shaped void 220 to be formed proximate to the center of the intended memory cell. The resultant film stack is shown in FIG. 2D.

Figure 2D:
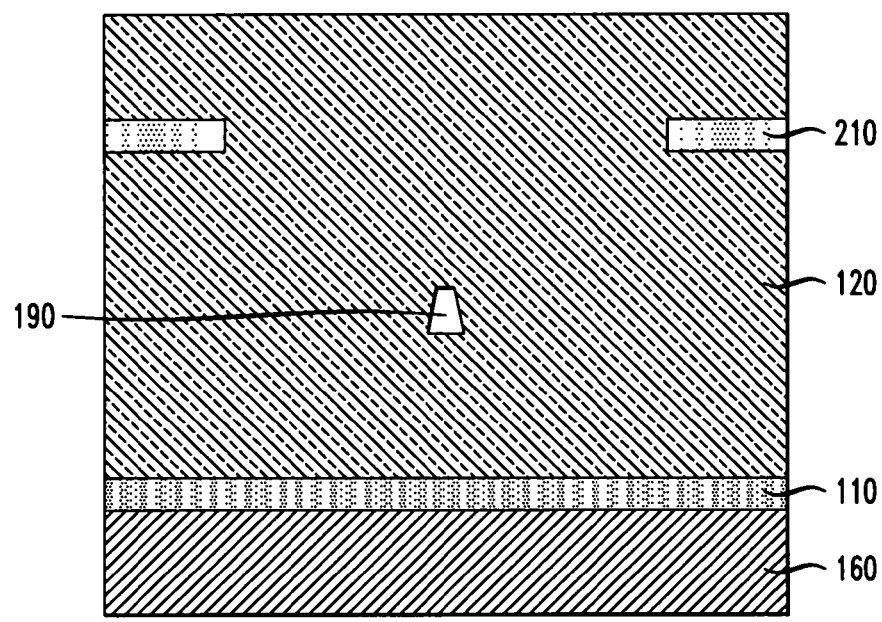
Figure 2E:
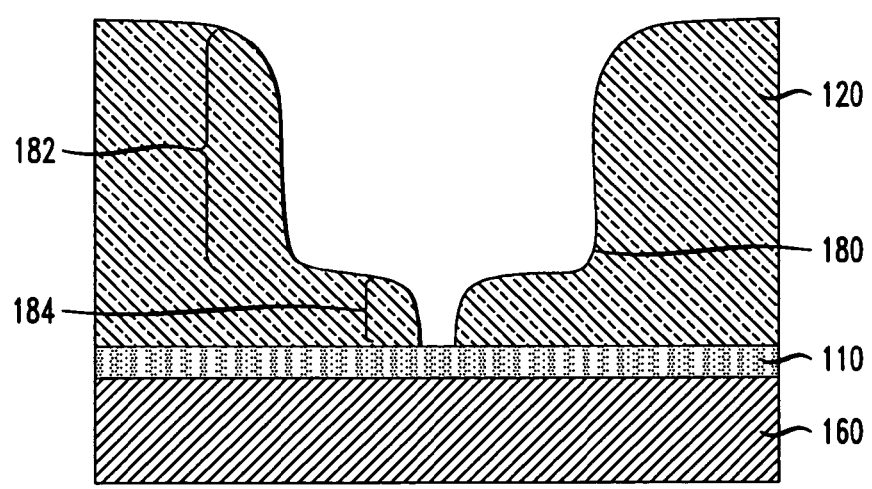

Next, the film stack in FIG. 2D is exposed to another anisotropic etching step, preferably RIE, that selectively etches the dielectric layer 120 but does not etch the masking layer 210. The keyhole-shaped void 220 causes the etching process to be locally advanced in the center of the memory cell. This etching step is allowed to progress until the dielectric layer is first removed from the lower liner 110. At this point, any dielectric material located on top of the masking layer has been removed. Subsequently a wet chemical etching step is used to selectively remove the masking layer while leaving the dielectric layer in place. If the masking layer is formed of silicon nitride and the dielectric layer is formed of silicon dioxide, this wet chemical etching step may comprise, for example, hot phosphoric acid. The resultant film stack is shown in FIG. 2E. It will be observed that the wide portion 182 and narrow portion 184 of the trench 180 in the dielectric layer are now defined.

Figure 2F:
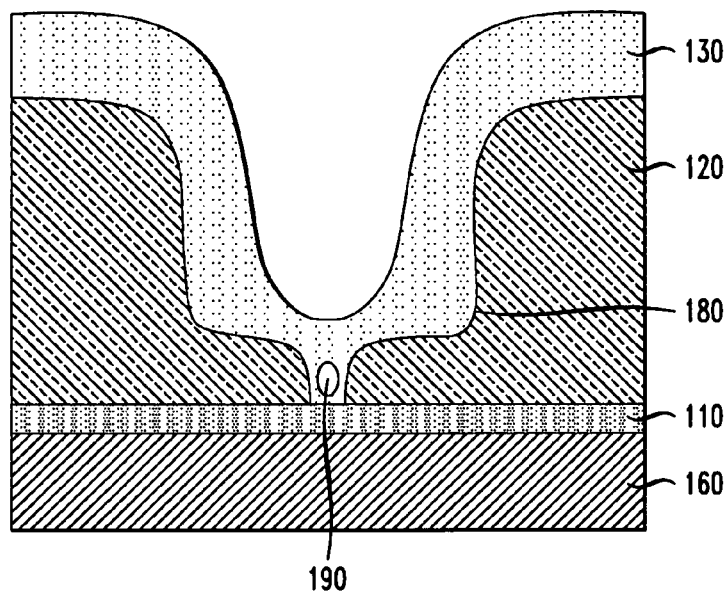

At this point in the fabrication process, the PCM 130 (e.g., GST) is deposited on the film stack such that the void 190 is formed in the PCM within the narrow portion 184 of the trench 180. This deposition is preferably by sputter deposition. The gap-fill characteristics of a sputter deposition process are relatively poor compared to most CVD processes. Moreover, the gap-fill properties of sputter deposition are dependent on a number of adjustable processing parameters including, for example, deposition pressure, deposition temperature and the directionality of the deposition with respect to the sputtering source. One skilled in the art will recognize how to modify these sputter processing parameters to reproducibly form the void in the PCM. The film stack after the deposition of the PCM is shown in FIG. 2F.

Figure 2G:
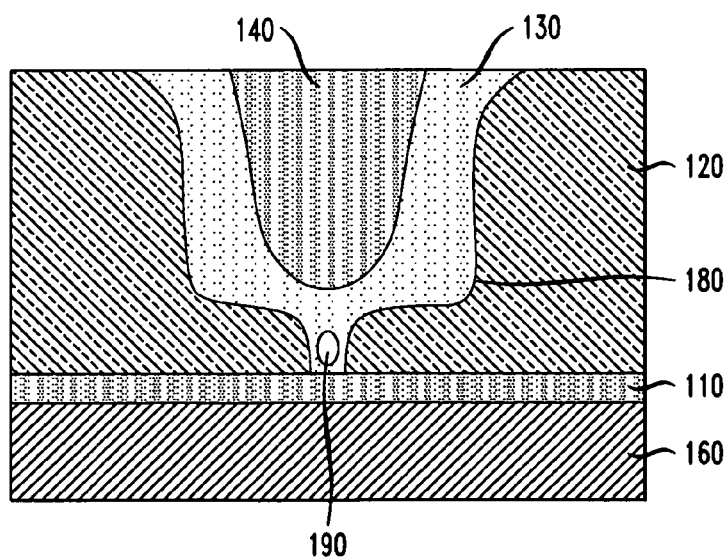

Subsequently, the electrode 140 (e.g., tantalum nitride or titanium nitride) is deposited on the film stack shown in FIG. 2F. The film stack is then exposed to a chemical mechanical polishing step (CMP) that removes the excess portions of the electrode and the PCM 130 that are located on the top surface of the dielectric layer 120. The film stack shown in FIG. 2G is thereby formed. Depositing the upper liner 150 (e.g., tantalum nitride or titanium nitride), preferably by CVD, and forming the top electrical contact 170 (e.g., copper) results in the memory cell 100 shown in FIG. 1.

It will be noted that, advantageously, the use of the processing sequence just described allows the narrow portion 184 of the trench 180 in the dielectric layer 120 to have a width that is substantially smaller than that which can be formed by conventional photolithograpic techniques. In fact, photolithography is only used once in the process to pattern the dielectric layer and masking layer 210 in the processing steps corresponding to FIG. 2B. The width of the trench in FIG. 2B is several times larger than the width of the narrow portion of the trench in the dielectric layer in the final memory cell 100 shown in FIG. 1.

The processes described herein may be implemented to form an integrated circuit. In forming integrated circuits a plurality of identical die is typically fabricated in a repeated pattern on a surface of a semiconductor wafer. Each die includes a memory cell formed by the methods falling within the scope of the invention set forth herein, and may also include other structures or circuits. The individual die are cut or diced from the semiconductor wafer and then packaged as integrated circuits. One skilled in the art will know how to dice wafers and package die to produce integrated circuits. Integrated circuits so manufactured are considered part of this invention.

Although illustrative embodiments of the present invention have been described herein with reference to the accompanying figures, it is to be understood that the invention is not limited to those precise embodiments, and that various other changes and modifications can be made to these embodiments by one skilled in the art without departing from the scope of the appended claims.

What is claimed is:

1. A memory cell comprising:
   a dielectric layer, the dielectric layer defining a trench having a wide portion and a narrow portion, the narrow portion substantially narrower than the wide portion; and
   a phase change material, the phase change material at least partially filling the wide and narrow portions of the trench, and the phase change material within the narrow portion defining a void;
   wherein a portion of the phase change material is operative to switch between lower and higher electrical resistance states in response to an application of a pulse of electrical current to the memory cell.

2. The memory cell of claim 1, wherein the portion of the phase change material operative to switch between lower and higher electrical resistance states is located within the narrow portion of the trench.

3. The memory cell of claim 2, wherein the portion of the phase change material operative to switch between lower and higher electrical resistance states is located substantially proximate to at least part of a periphery of the void.

4. The memory cell of claim 1, wherein a width of the narrow portion of the trench is less than a prescribed minimum lithographic dimension.

5. The memory cell of claim 1, wherein the memory cell further comprises:
   a lower liner, the lower liner contacting the phase change material within the narrow portion of the trench;
   a bottom electrical contact, the bottom electrical contact contacting the lower liner;
   an upper liner, the upper liner contacting the phase change material within the wide portion of the trench; and
   a top electrical contact, the top electrical contact contacting the upper liner;
   wherein the bottom and top electrical contacts are adapted to receive the pulse of electrical current applied to the memory cell.

6. The memory cell of claim 5, wherein at least one of the lower and upper liners comprises tantalum nitride or titanium nitride.

7. The memory cell of claim 1, wherein the phase change material within the wide portion of the trench defines a recess in the phase change material, and an electrically conductive material fills at least a portion of the recess.

8. The memory cell of claim 1, wherein the phase change material comprises germanium, antimony, sulfur, selenium or tellurium, or a combination thereof.

9. The memory cell of claim 1, wherein the phase change material comprises a ternary alloy comprising germanium, antimony and tellurium.

10. The memory cell of claim 1, wherein the phase change material comprises a transition metal oxide.

11. An integrated circuit comprising one or more memory cells, at least one of the memory cells comprising a dielectric layer, the dielectric layer defining a trench having a wide portion and a narrow portion, the narrow portion substantially narrower than the wide portion, and a phase change material, the phase change material at at least partially filling the wide and narrow portions of the trench and the phase change material within the narrow portion defining a void, wherein a portion of the phase change material is operative to switch between lower and higher electrical resistance states in response to an application of a pulse of electrical current to the memory cell.

12. The integrated circuit of claim 11, wherein the integrated circuit comprises a random access memory.

13. The integrated circuit of claim 11, wherein the integrated circuit comprises a nonvolatile memory.

* * * * *